US012666605B2

(12) United States Patent
Chu

(10) Patent No.: US 12,666,605 B2
(45) Date of Patent: Jun. 23, 2026

(54) SEMICONDUCTOR STRUCTURE USING LINING LAYER TO PREVENT ELECTRICAL CONNECTION BETWEEN CONTACTS AND MANUFACTURING METHOD THEREOF

(71) Applicant: NANYA TECHNOLOGY CORPORATION, New Taipei City (TW)

(72) Inventor: Yen-Ho Chu, Hsinchu City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 759 days.

(21) Appl. No.: 18/055,421

(22) Filed: Nov. 15, 2022

(65) Prior Publication Data

US 2024/0164088 A1     May 16, 2024

(51) Int. Cl.
*H10B 12/00*         (2023.01)
(52) U.S. Cl.
CPC ........... *H10B 12/485* (2023.02); *H10B 12/30* (2023.02); *H10B 12/31* (2023.02); *H10B 12/48* (2023.02); *H10B 12/482* (2023.02)
(58) Field of Classification Search
CPC ........ H10B 12/30; H10B 12/31; H10B 12/48; H10B 12/482; H10B 12/485
See application file for complete search history.

(56) References Cited

U.S. PATENT DOCUMENTS

| | | | |
|---|---|---|---|
| 2006/0160323 A1* | 7/2006 | Wells | H10B 12/053 |
| | | | 438/424 |
| 2016/0276273 A1 | 9/2016 | Kwon et al. | |
| 2022/0052055 A1* | 2/2022 | Chun | H10B 12/053 |
| 2024/0081076 A1* | 3/2024 | Gupta | H10B 41/10 |

FOREIGN PATENT DOCUMENTS

| | | | | |
|---|---|---|---|---|
| DE | 102020115179 A1 | * | 4/2021 | ....... H01L 21/76832 |
| TW | I742730 B | * | 10/2021 | ....... H01L 21/76224 |
| TW | 202306110 A | * | 2/2023 | ............. H10B 12/34 |

* cited by examiner

*Primary Examiner* — Matthew E Warren

(74) *Attorney, Agent, or Firm* — CKC & Partners Co., LLC

(57)         ABSTRACT

Some embodiments of the present disclosure provide a semiconductor structure including a dielectric layer stack, an isolation structure, a lining layer and a contact. The isolation structure is in contact with a sidewall of the dielectric layer stack, and the sidewall of the dielectric layer stack and a sidewall of the isolation structure define a sharp corner. The lining layer is at the sharp corner, and a sidewall of the lining layer, the sidewall of the dielectric layer stack and the sidewall of the isolation structure define a round corner. The contact is in contact with the sidewall of the dielectric layer stack, the sidewall of the isolation structure and the sidewall of the lining layer.

14 Claims, 16 Drawing Sheets

100

SEMICONDUCTOR STRUCTURE USING LINING LAYER TO PREVENT ELECTRICAL CONNECTION BETWEEN CONTACTS AND MANUFACTURING METHOD THEREOF

BACKGROUND

Field of Disclosure

The present disclosure relates to a semiconductor structure and the manufacturing method thereof.

Description of Related Art

The memory cell is used in variety of electronics nowadays. The memory cell is an electronic circuit that stores data, and the memory cell may include a plurality of contacts arranged in an array. Since the sizes of the memory cell is gradually reduced nowadays, the manufacturing method of the contacts in the memory cell is facing more challenges than before.

SUMMARY

Some embodiments of the present disclosure provide a semiconductor structure including a dielectric layer stack, an isolation structure, a lining layer and a contact. The isolation structure is in contact with a sidewall of the dielectric layer stack, and the sidewall of the dielectric layer stack and a sidewall of the isolation structure define a sharp corner. The lining layer is at the sharp corner, and a sidewall of the lining layer, the sidewall of the dielectric layer stack and the sidewall of the isolation structure define a round corner. The contact is in contact with the sidewall of the dielectric layer stack, the sidewall of the isolation structure and the sidewall of the lining layer.

In some embodiments, a contour of the contact has a round corner defined by the sidewall of the dielectric layer stack, the sidewall of the isolation structure and the sidewall of the lining layer.

In some embodiments, an interface is between the lining layer and the isolation structure.

In some embodiments, the dielectric layer stack includes a bottom portion under and in contact the lining layer.

In some embodiments, the semiconductor structure further includes a bitline, and the dielectric layer stack has a first portion between the bitline and the contact and a second portion between the bitline and the isolation structure.

In some embodiments, the dielectric layer stack includes a first nitride layer, an oxide layer and a second nitride layer arranged from the bitline to the contact.

In some embodiments, the semiconductor structure further includes an active area under the contact and in contact with the contact.

Some embodiments of the present disclosure provide a semiconductor structure including a dielectric layer stack, an isolation structure, a contact and a lining layer. The isolation structure is in contact with a sidewall of the dielectric layer stack, wherein the sidewall of the dielectric layer stack and a sidewall of the isolation structure define a sharp corner. The contact is in contact with the sidewall of the dielectric layer stack and the sidewall of the isolation structure, wherein the contact has a round corner in a top view. The lining layer is between the contact, the isolation structure and the dielectric layer stack.

In some embodiments, the round corner of the contact is adjacent to the sharp corner defined by the sidewall of the dielectric layer stack and the sidewall of the isolation structure.

In some embodiments, the lining layer has a first concave surface in contact with the isolation structure and a second concave surface in contact with the contact.

In some embodiments, compositions of the lining layer and the isolation structure are different.

In some embodiments, a minimum width of the contact parallel to the sidewall of the dielectric layer stack is at the sidewall of the dielectric layer stack.

In some embodiments, a maximum width of the contact parallel to the sidewall of the dielectric layer stack is substantially at the center of the contact.

In some embodiments, the dielectric layer stack comprises a bottom portion under and in contact the lining layer, and a sidewall of the lining layer is aligned with a sidewall of the bottom portion of the dielectric layer stack.

Some embodiments of the present disclosure provide a manufacturing method of a semiconductor structure.

A memory structure is formed and includes two bitlines, a dielectric layer stack between the two bitlines, an isolation structure in contact with the dielectric layer stack and a sacrificial contact layer in contact with the isolation structure and the dielectric layer stack, and a dielectric layer of the dielectric layer stack is in U-shaped, an active area is under a bottom of the dielectric layer stack. The sacrificial contact layer is removed to form a first opening in the dielectric layer stack. A lining layer is conformally formed along the sidewall of the first opening in the dielectric layer stack. Portions of the lining layer at the sidewall of the dielectric layer stack are removed, such that a remaining portion of the lining layer remains at a sharp corner defined by the isolation structure and the dielectric layer stack. The bottom of the dielectric layer is removed to expose the active area. A contact is formed in the first opening of the dielectric layer stack.

In some embodiments, removing the portions of the lining layer at the sidewall of the dielectric layer stack is such that the sidewall of the dielectric layer is exposed.

In some embodiments, an etching gas used during removing the portions of the lining layer etches the lining layer at the sidewall of the dielectric layer stack faster than etches the lining layer in the sharp corner.

In some embodiments, an etching gas used during removing the portion of the lining layer is different from an etchant used during removing the bottom of the dielectric layer stack.

In some embodiments, the remaining portion of the lining layer has a concave surface connecting the sidewall of the dielectric layer stack and the sidewall of the isolation structure after removing the portions of the lining layer at the sidewall of the dielectric layer stack.

In some embodiments, forming the memory structure includes forming a sacrificial contact layer in the dielectric layer stack, patterning the sacrificial contact layer to form a second opening in the sacrificial contact layer, and forming the isolation structure in the second opening in the sacrificial contact layer.

Some embodiments of the present disclosure provide advantages. Specifically, the lining layers are formed in the sharp corners between the isolation structures and the dielectric layer stack. Therefore, the contacts formed between the isolation structures do not extend through the sharp corners to connect with other, thereby reducing the possibility of short circuits between the contacts.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figures 1A, 1B:
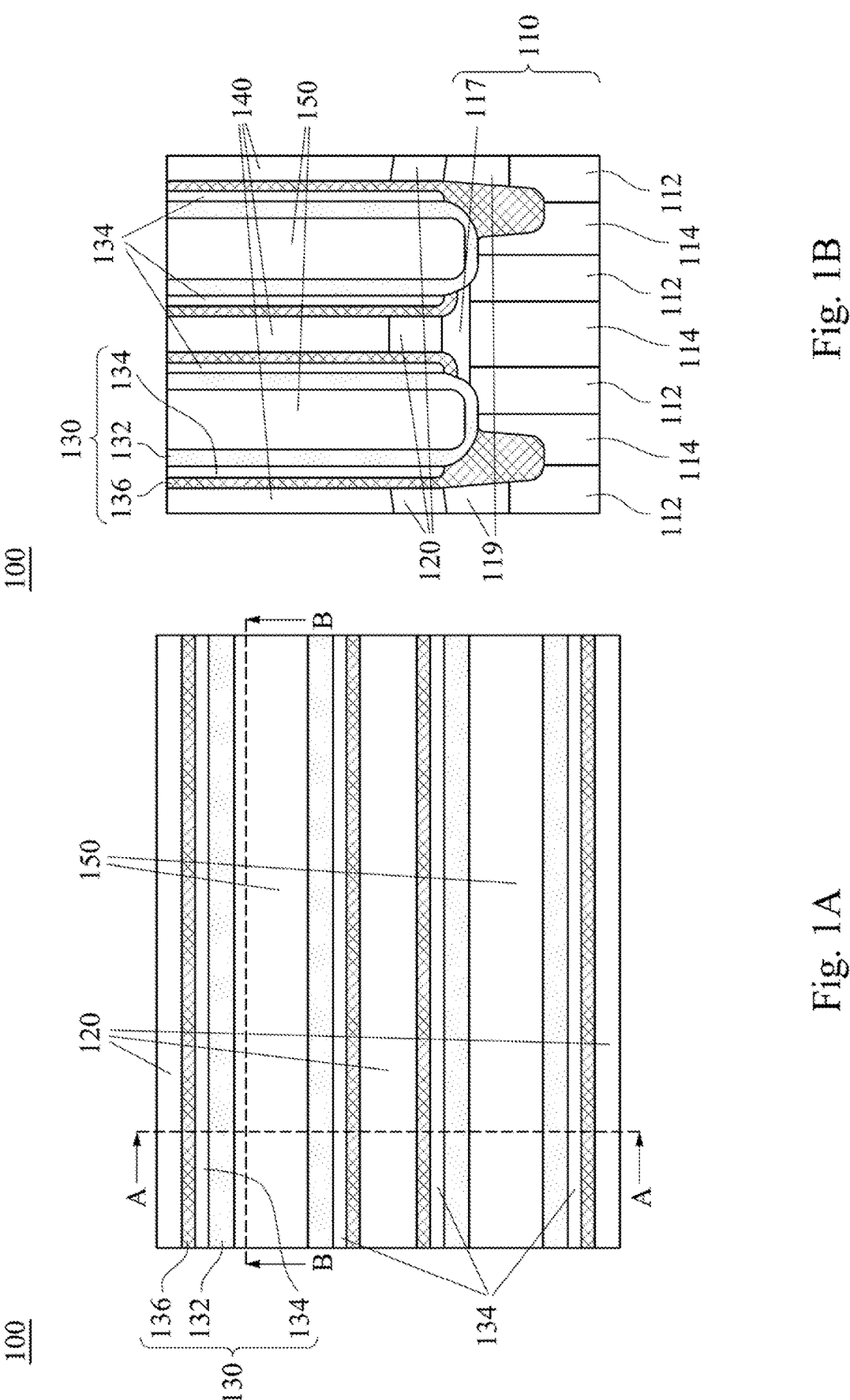
FIGS. 1A-8C illustrate a method for manufacturing a semiconductor device in intermediate stages in some embodiments of the present disclosure.
Figure 1C:
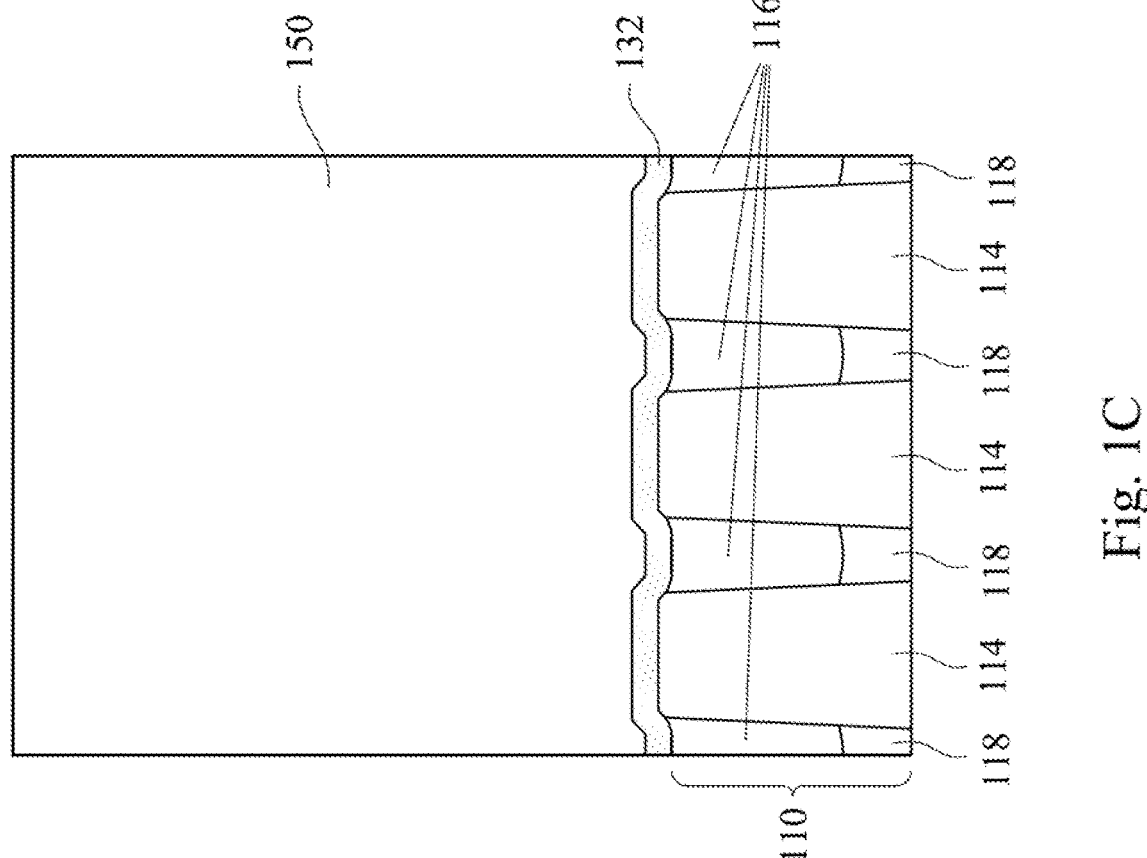

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure are related to the method of forming cell contacts with round corners. Isolation structures are between the cell contacts to separate the cell contacts from each other. In the various embodiments of the present disclosure, a lining layer is formed between the isolation structure and the cell contact to reduce the possibility of short circuits between the cell contacts. Moreover, the cell contacts with round corners are formed with less voids in the present disclosure. The semiconductor structures in some embodiments of the present disclosure are used in memory devices.

FIGS. 1A-8C illustrate a method for manufacturing a semiconductor device in intermediate stages in some embodiments of the present disclosure. FIGS. 1A, 2A, 3A, 4A, 5A, 6A, 7A, and 8A illustrate top views of a semiconductor device in intermediate stages of the process in some embodiments of the present disclosure. FIGS. 1B, 2B, 3B, 4B, 5B, 6B, 7B, and 8B illustrate cross-section views of the semiconductor device taken along line A-A respectively in FIGS. 1A, 2A, 3A, 4A, 5A, 6A, 7A, and 8A in some embodiments of the present disclosure. FIGS. 1C, 2C, 3C, 4C, 5C, 6C, 7C, and 8C illustrate cross-section views of the semiconductor device taken along line B-B respectively in FIGS. 1A, 2A, 3A, 4A, 5A, 6A, 7A, and 8A in some embodiments of the present disclosure. Referring to FIGS. 1A-1C, a memory structure 100 is formed. The memory structure 100 includes a bottom structure 110, bitlines 120, dielectric layer stacks 130, dielectric layers 140 and sacrificial contact layers 150. The bottom structure 110 includes active areas 112, isolation layers 114, 116, 117, word lines 118 and contacts 119. The active areas 112 are between the isolation layers 114 and separated by the isolation layers 114. In FIG. 1B, the active areas 112 and the isolation layers 114 are arranged alternately. In FIG. 1C, the isolation layers 114 and 116 are arranged alternately. In some other cross section views parallel to the view shown in FIG. 1C, the active areas 112 and the isolation layers 116 are arranged alternately. The isolation layers 117 are on some of the active areas 112 and one of the isolation layers 114. The contacts 119 are on some other of the active areas 112 and in contact with those active areas. The contacts 119 serve as the bitline contacts in the present embodiments. The word lines 118 are between the isolation layers 114 and separated by the isolation layers 114, and the word lines 118 are under the isolation layers 116. In some embodiments, the active areas 112 are made of silicon, the isolation layers 114 are made of oxide, the isolation layer 116 and 117 are made of nitride, the contacts 119 are made of silicon, and the word lines 118 are made of metal, such as tungsten.

The bitlines 120 are on the isolation layer 116 and the contacts 119. The dielectric layer stacks 130 are between the bitlines 120. The dielectric layer stacks 130 include a first nitride layer 132, an oxide layer 134 and a second nitride layer 136. The first nitride layer 132 is adjacent the bitline 120, the oxide layer 134 is adjacent the first nitride layer 132, and the second nitride layer 136 is adjacent the oxide layer 134. That is, the oxide layer 134 is between the first nitride layer 132 and the second nitride layer 136. The bottom of the first nitride layer 132 and the second nitride layer 136 are in contact. Therefore, the bottoms of the oxide layer 134 are wrapped around by the first nitride layer 132 and the second nitride layer 136. A dielectric layer of the dielectric layer stack 130 (such as the first nitride layer 132) is in U-shaped, and the active areas 112 are under the bottom of the dielectric layer stack 130. In some embodiments, a portion of the dielectric layer stacks 130 are extended into the active areas 112. The bitlines 120 may be made of any suitable material, such as metal, metal nitrides, or combinations thereof. It is noted that an interface between the first nitride layer 132 and the second nitride layer 136 is shown in FIG. 1B for convenience of distinguishing the first nitride layer 132 and the second nitride layer 136 in the description. In some embodiments, the interface between the first nitride layer 132 and the second nitride layer 136 is not presented. The dielectric layers 140 are on the bitlines 120 and between the first nitride layers 132. In some embodiments, the dielectric layers 140 are made of nitride.

The sacrificial contact layers 150 are formed in the dielectric layer stack 130, such as in the U shaped first nitride layers 132. That is, the sacrificial contact layers 150 are wrapped by the first nitride layers 132, and the bottom of the sacrificial contact layers 150 are not in contact with the bottom structure 110 of the memory structure 100. The material of the sacrificial contact layers 150 is different from the material of the first nitride layers 132. In some embodiments, the sacrificial contact layers 150 are made of oxide. For clarity, FIG. 1A only illustrates the bitlines 120, the dielectric layer stacks 130 and the sacrificial contact layers 150, and other components (such as the dielectric layer 140) described above are omitted in FIG. 1A.

Figure 2B:
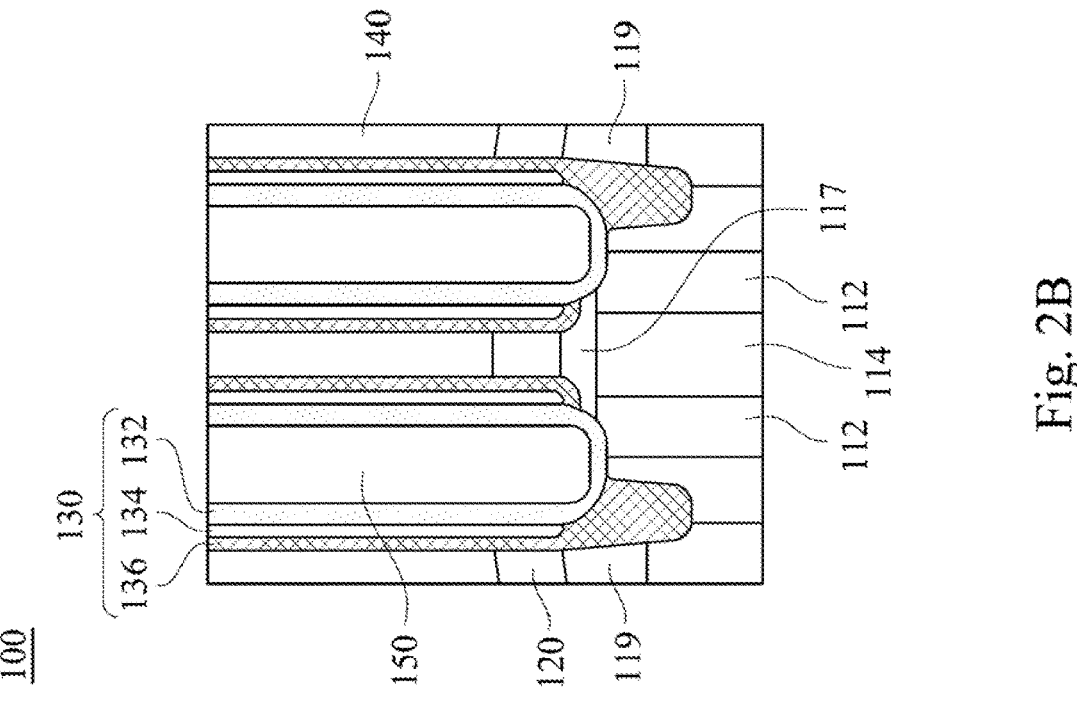
Figure 2A:
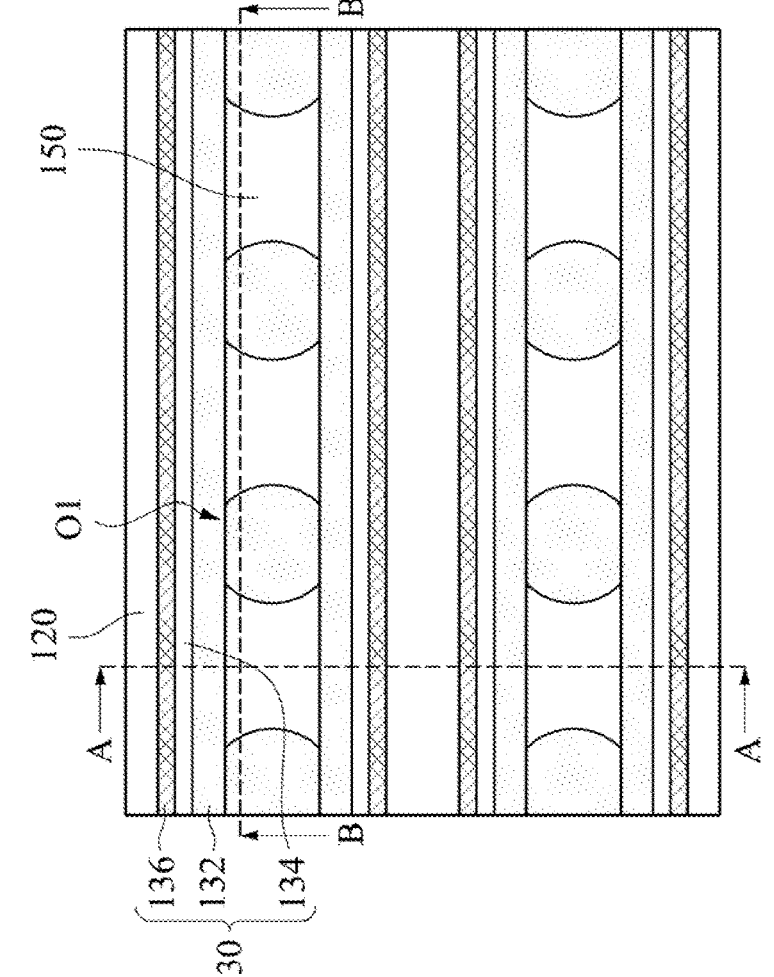
Figure 2C:
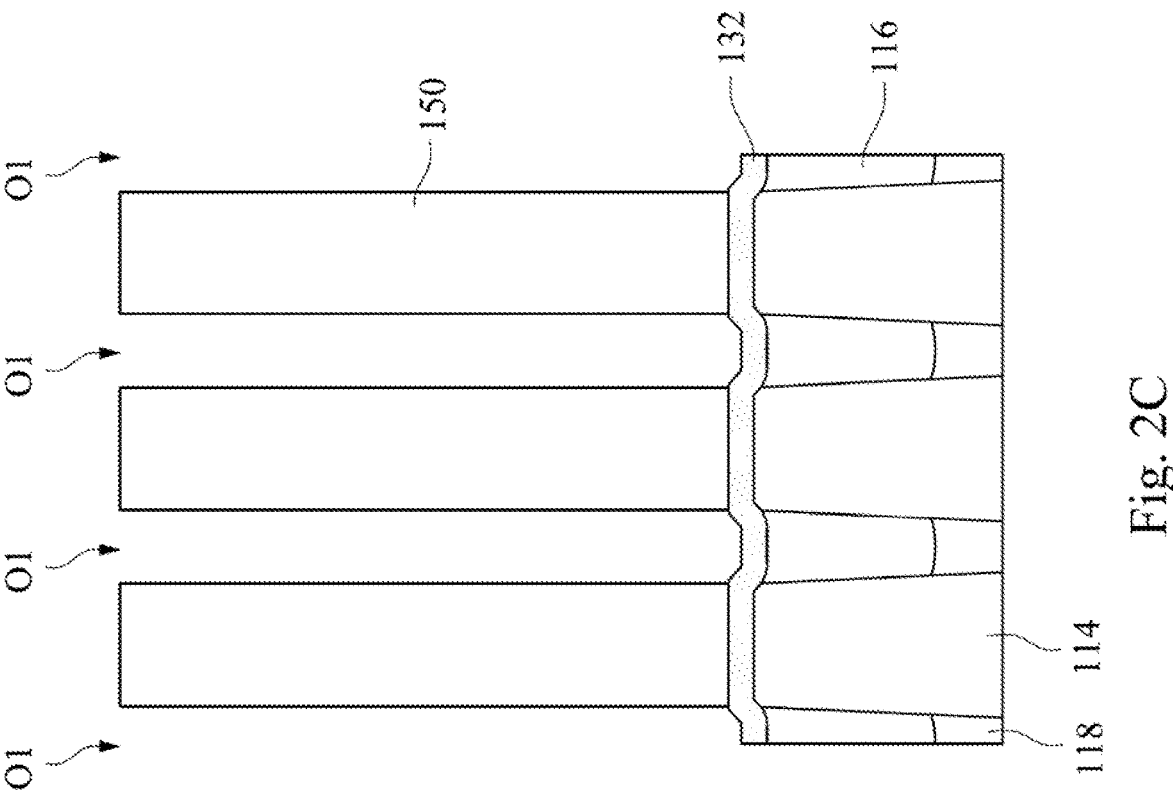

Referring to FIGS. 2A-2C, the sacrificial contact layers 150 are patterned to form openings O1 in the sacrificial contact layers 150. Specifically, the openings O1 are formed in the sacrificial contact layers 150, and portions of the sidewalls and a portion of the bottom of the first nitride layers 132 are exposed by each of the openings O1, as shown in FIG. 2C. Further, the openings O1 are located over the isolation layers 116, respectively. In some embodiments, the sacrificial contact layers 150 may be etched by using an etching process. The openings O1 may be formed in any suitable shape. For example, the openings O1 may be round.

Figure 3B:
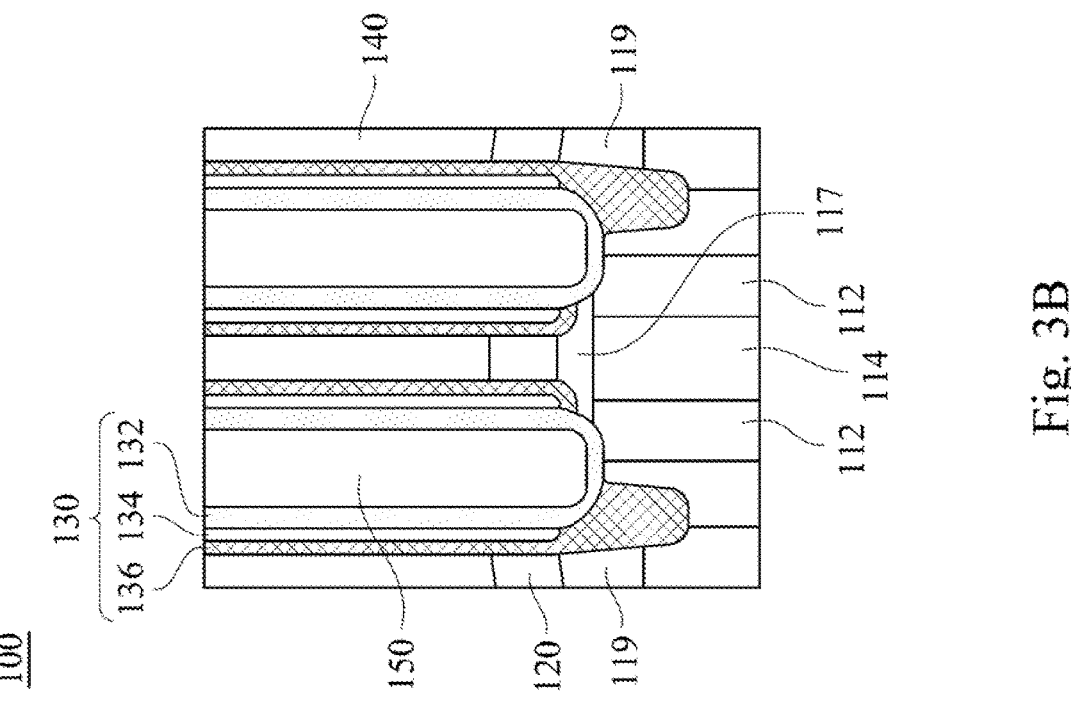
Figure 3A:
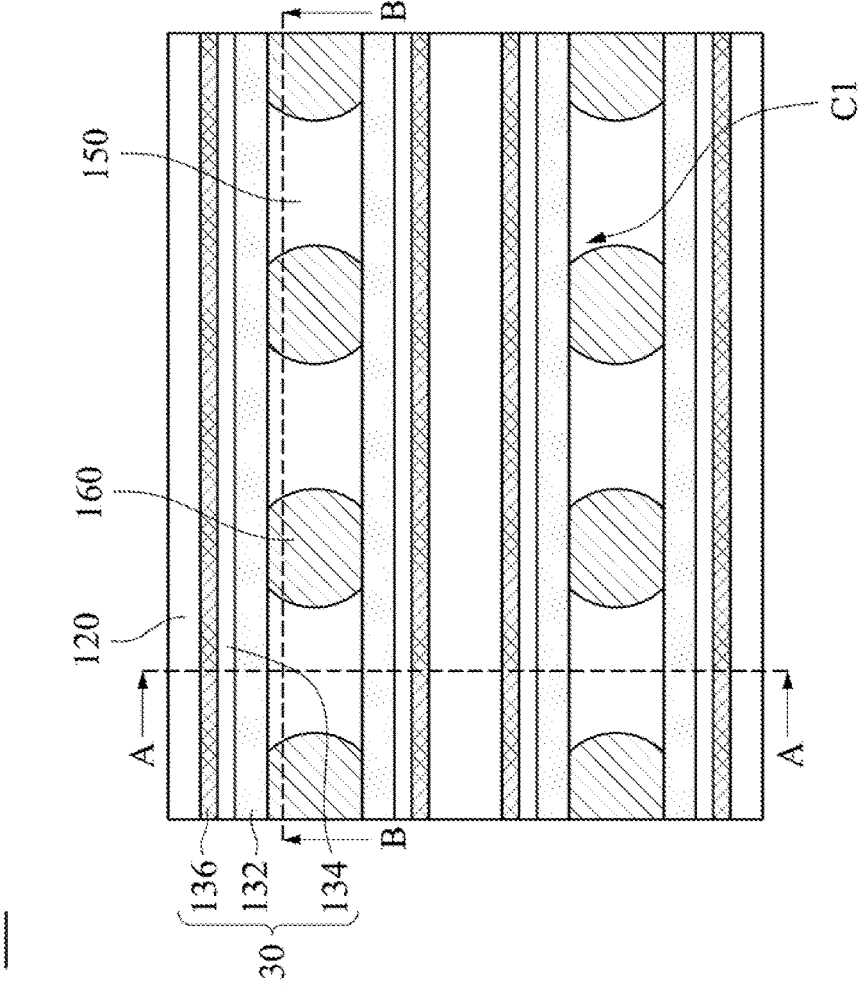
Figure 3C:
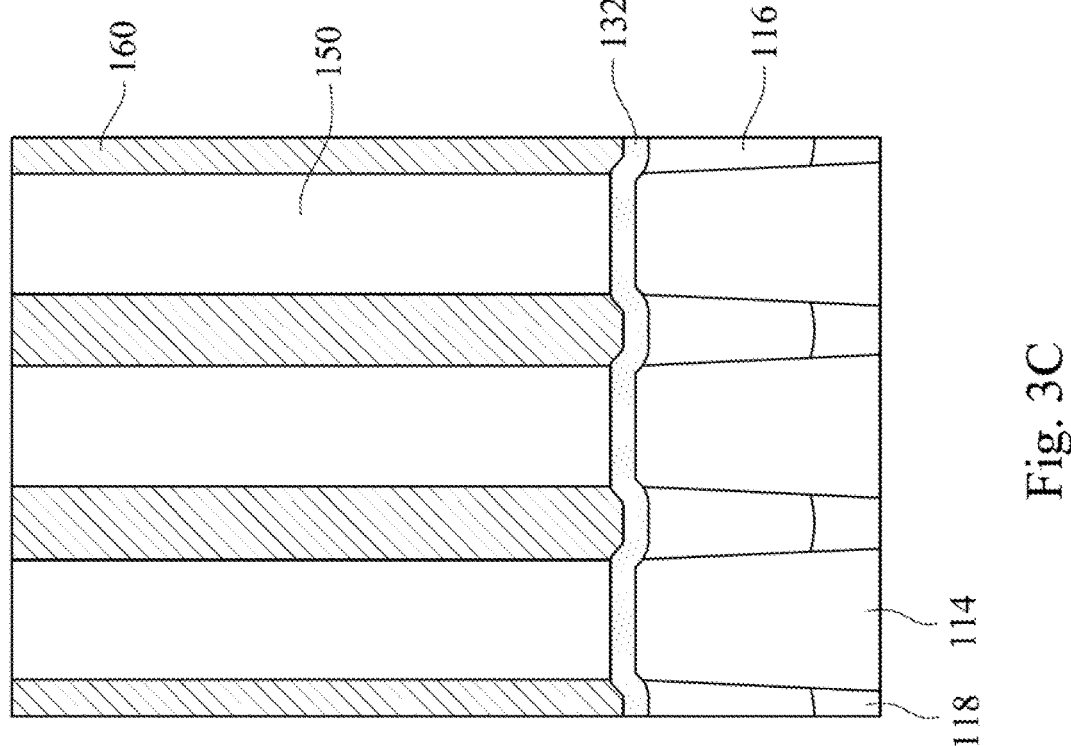

Referring to FIGS. 3A-3C, isolation structures 160 are formed in the openings O1 in the sacrificial contact layers 150. The sidewalls and the bottom of the isolation structures 160 are in contact with the first nitride layers 132. In some embodiments, the isolation structures 160 are made of nitride. In some embodiments, since the openings O1 are round, the sidewall of the first nitride layer 132 of the dielectric layer stack 130 and the sidewall of the isolation structure 160 define a sharp corner C1. At this point, the memory structure 100 includes the bitlines 120, the dielectric layer stack 130 between the bitlines 120, the isolation structure 160 is in contact with the dielectric layer stack 130 and the sacrificial contact layer 150 is in contact with the isolation structure 160 and the dielectric layer stack 130.

Figure 4B:
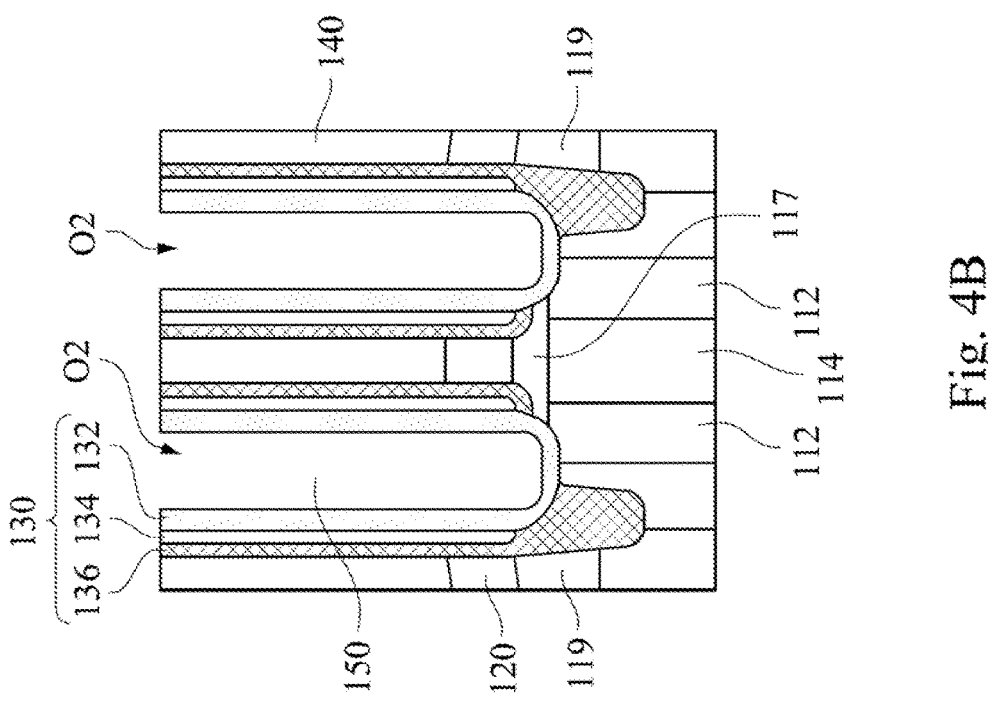
Figure 4A:
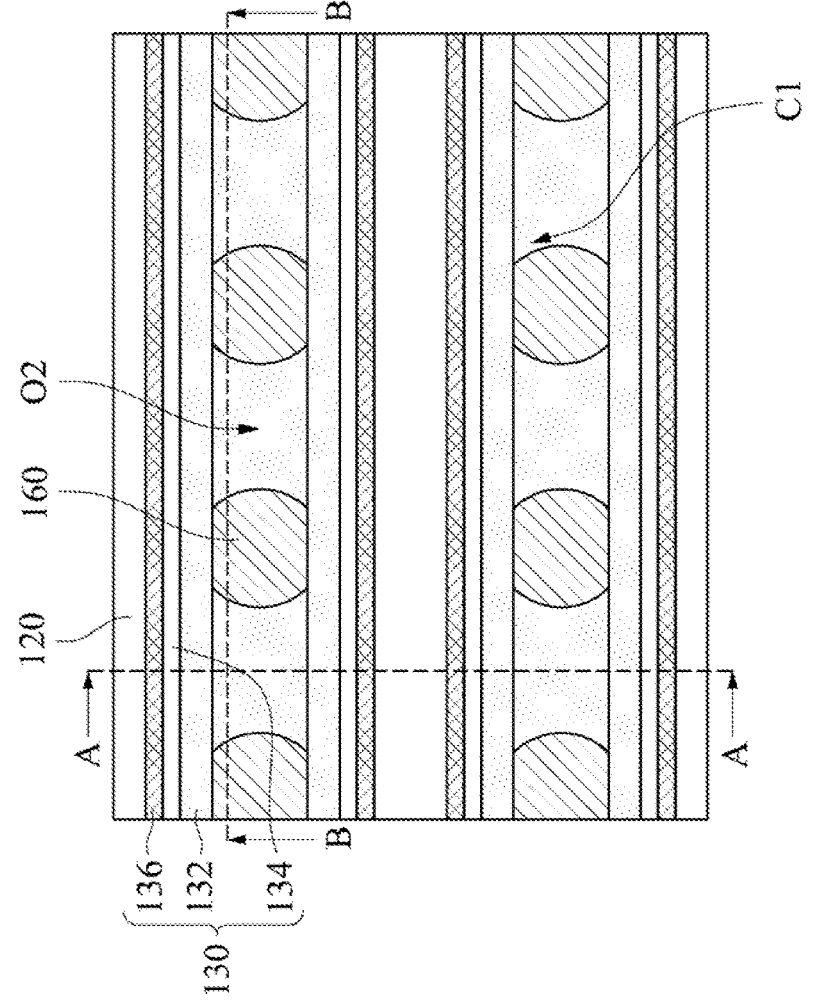
Figure 4C:
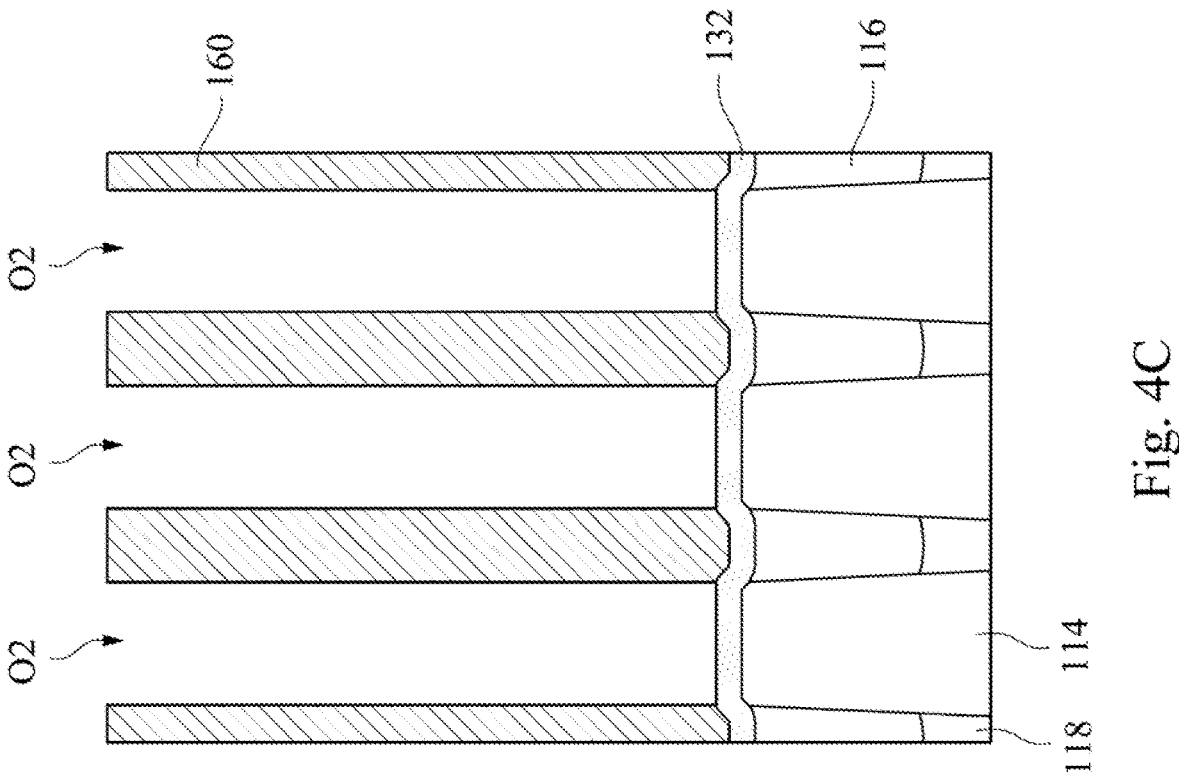

Referring to FIGS. 4A-4C, the sacrificial contact layers 150 are removed, thus resulting in openings O2 between the dielectric layer stack 130 and the corresponding isolation structures 160. Specifically, the openings O2 are formed in the first nitride layers 132 of the dielectric layer stack 130, and portions of the bottom of the first nitride layers 132 are exposed, as shown in FIG. 4C. The contour of the opening O2 may be defined by U-shaped first nitride layer 132 and the sidewalls of the adjacent isolation structures 160. The sidewall of the first nitride layer 132 is substantially straight, and the sidewalls of the isolation structures 160 are convex. Therefore, the opening O2 has the sharp corner C1 defined by the sidewall of the first nitride layer 132 of the dielectric layer stack 130 and the sidewall of the isolation structure 160. The width of the openings O2 becomes smaller as being farther from the first nitride layer 132 in the top view. The sacrificial contact layers 150 are removed by any suitable method, such as dry etching, wet etching, or combinations thereof. For example, a photoresist layer is formed over the structure illustrated in FIG. 3A, and then patterned to expose the sacrificial contact layers 150 (and the first nitride layer 132 and isolation structure 160). A selective etching process is then performed to selectively remove the sacrificial contact layers 150. The selective etching process etches the sacrificial contact layers 150 with an etching rate faster than etches other dielectric layers (e.g., the first nitride layer 132 and isolation structures 160). In some embodiments, the sacrificial contact layers 150 are removed by using hydrofluoric acid (HF).

Figures 5A, 5B:
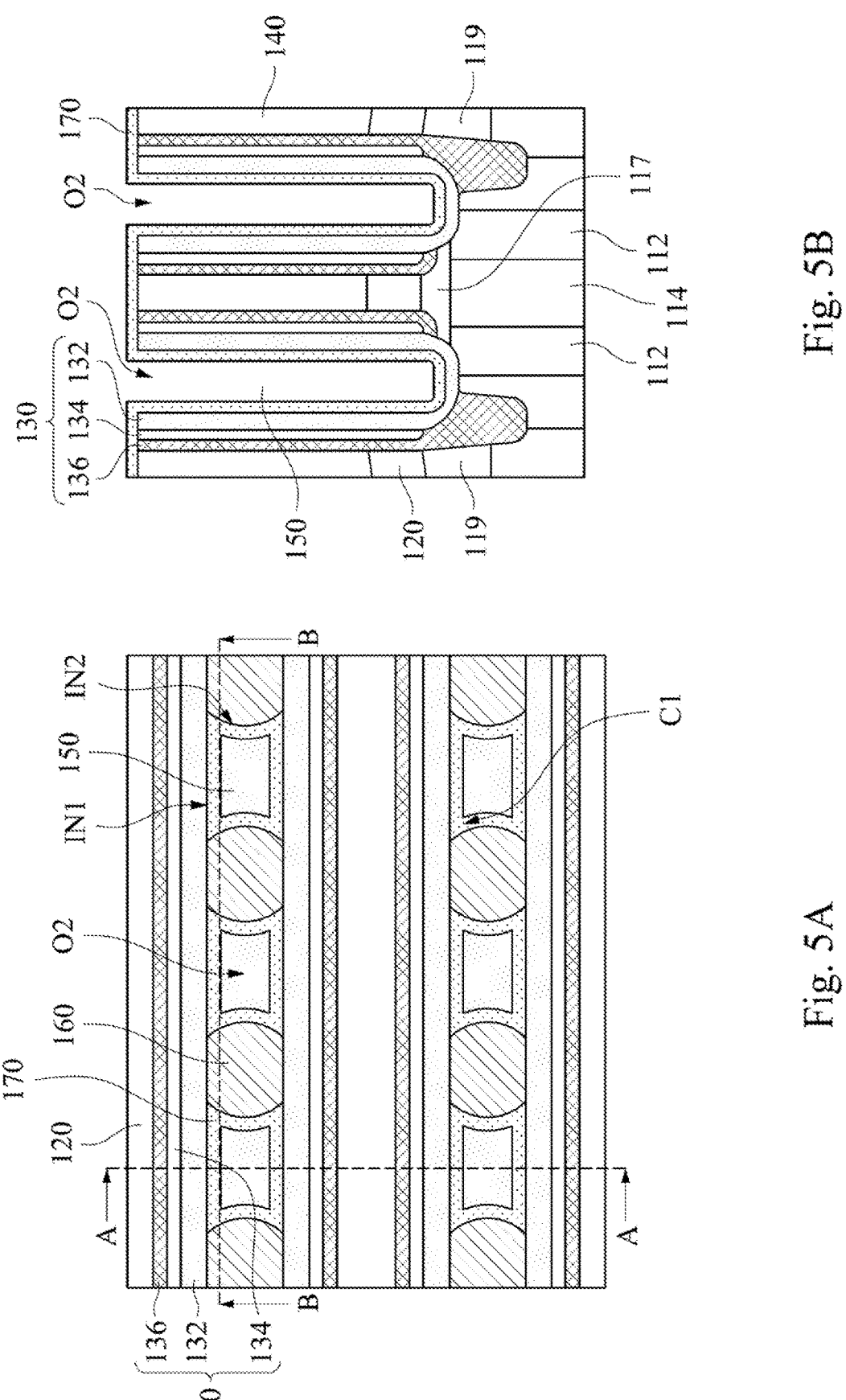
Figure 5C:
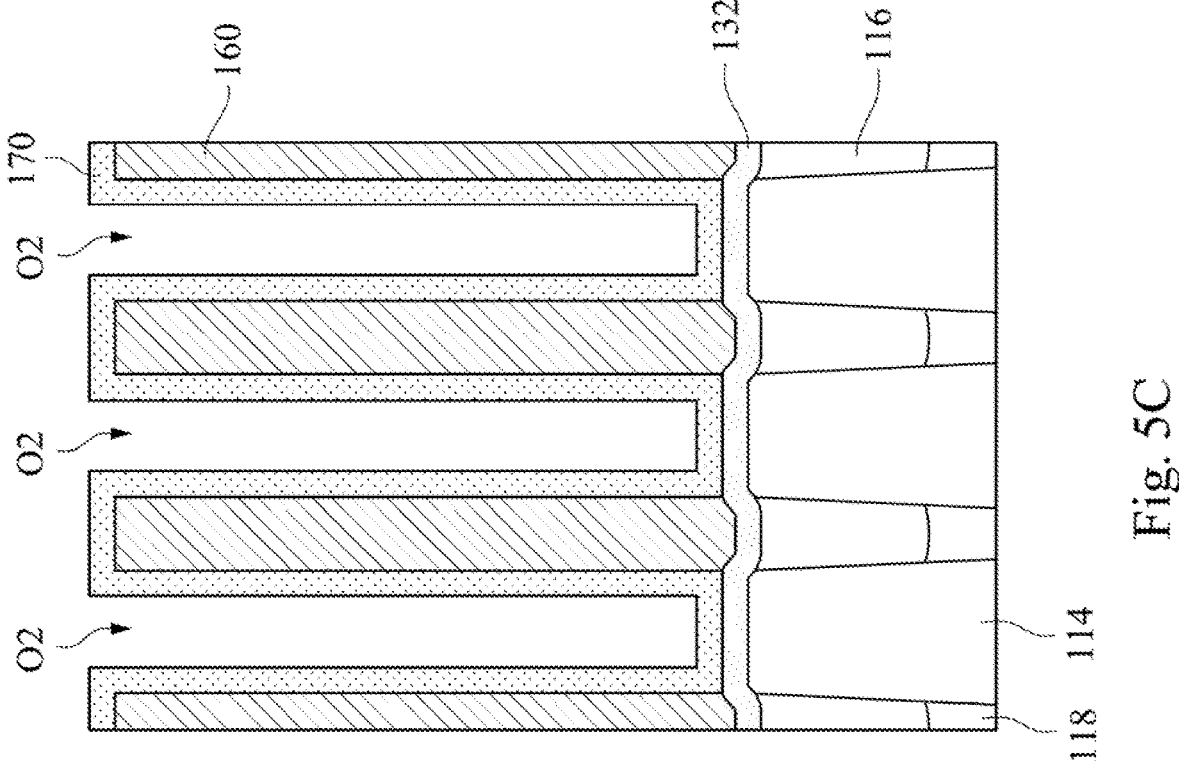

Referring to FIGS. 5A-5C, a lining layer 170 is conformally formed along the sidewall of the openings O2 located between the dielectric layer stack 130. Specifically, the lining layer 170 is conformally formed along the sidewalls of the first nitride layers 132 and the isolation structures 160 and the bottom of the first nitride layers 132 exposed in the openings O2. The lining layer 170 is further formed over the top surface of the memory structure 100. For clarity, FIG. 5A only illustrates that the lining layer 170 is formed in the opening O2 and the lining layer 170 over the top surface of the dielectric layer stack 130 is omitted. The lining layer 170 is made of any suitable materials. In some embodiments, the lining layers 170, the first nitride layers 132 and the isolation structures 160 are all made of the nitride, but recipes of forming the lining layers 170, and the first nitride layers 132 and the isolation structures 160 are different. The compositions or the physical properties of the lining layers 170, and the first nitride layers 132 and the isolation structures are different, resulting in different etching rates among the lining layer 170, the first nitride layers 132, and the isolation structures 160. Moreover, an interface IN1 is between the lining layer 170 and the first nitride layer 132, and an interface IN2 is between the lining layer 170 and the isolation structure 160.

Figure 6B:
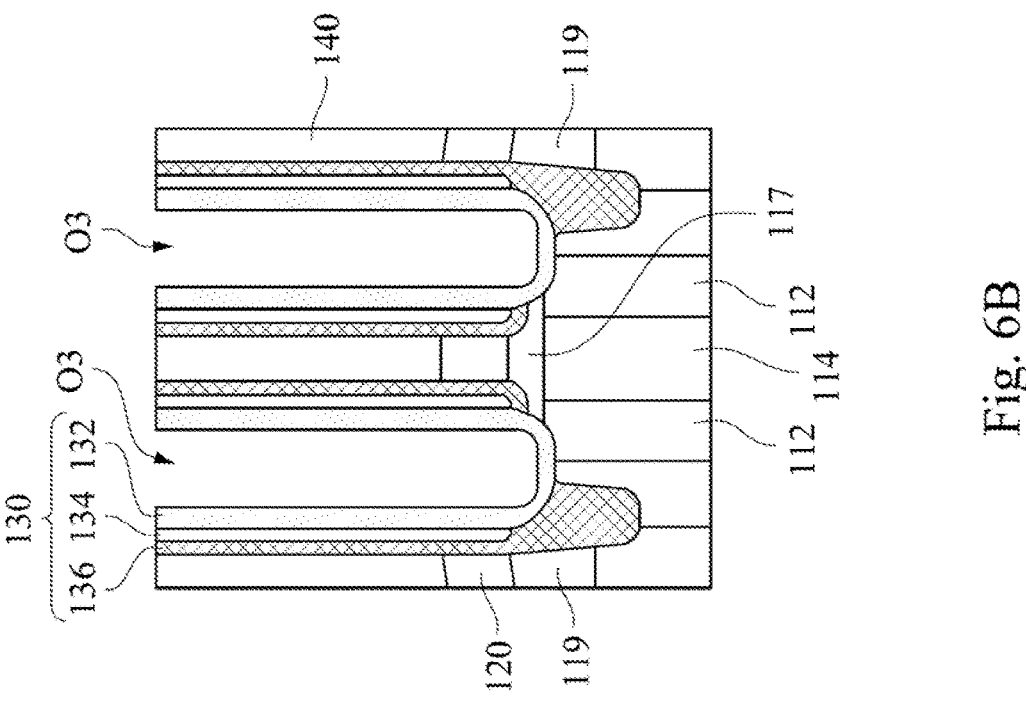
Figure 6A:
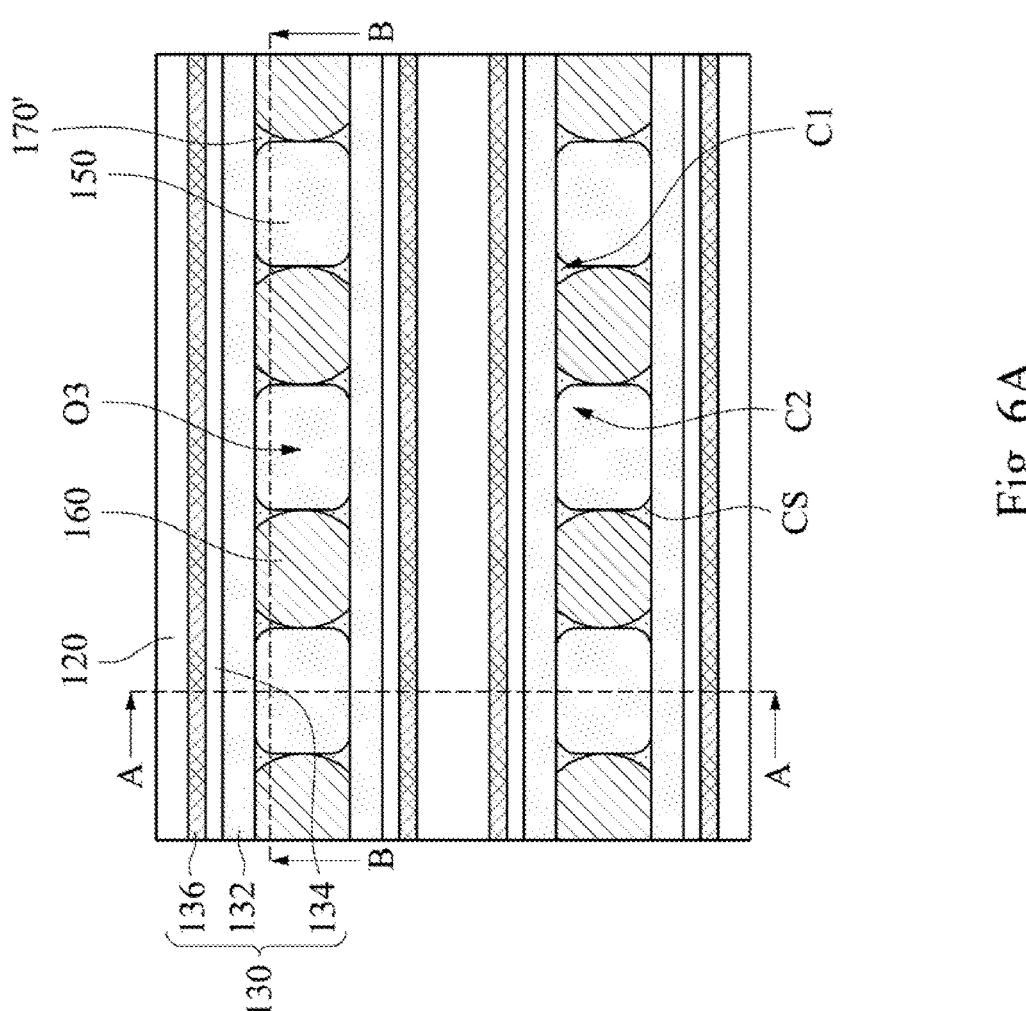
Figure 6C:
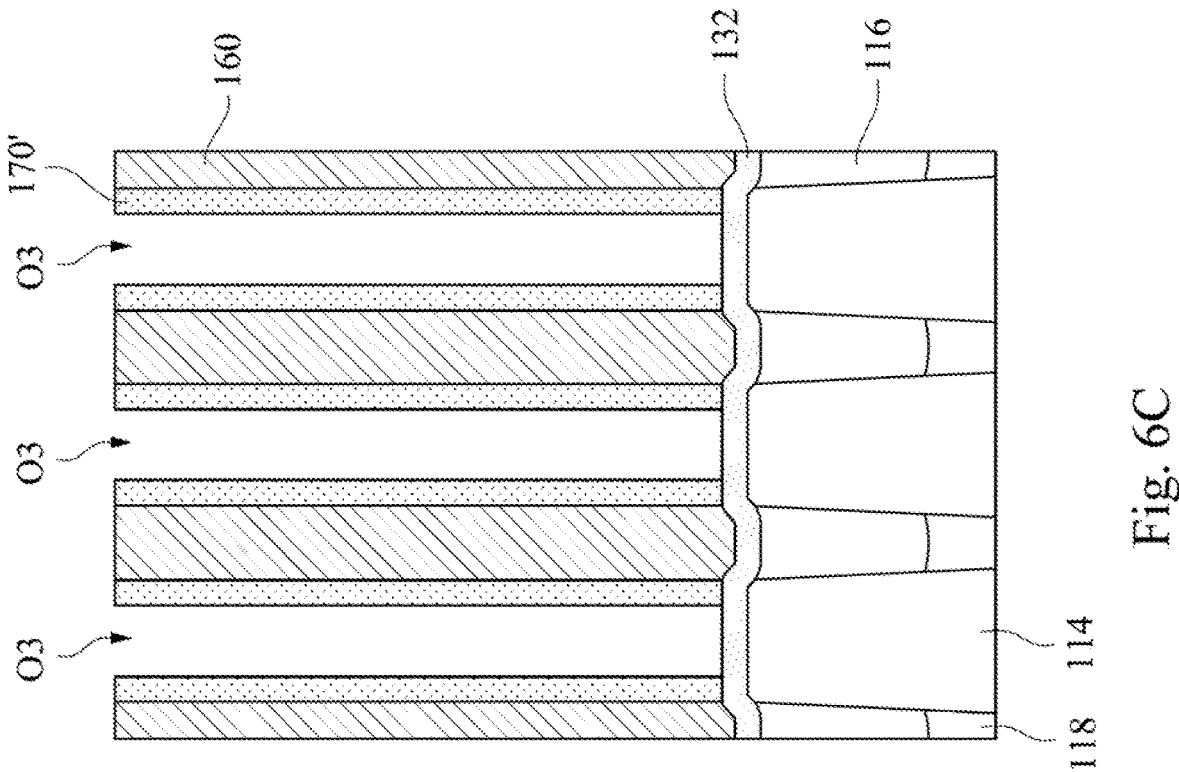

Referring to FIGS. 6A-6C, portions of the lining layer 170 at the sidewall, the bottom surface, and the top surface of the dielectric layer stack 130 are removed to form openings O3, such that some remaining portions of the lining layer 170 (referred to as lining layers 170') remain at the sharp corners C1 defined by the isolation structure 160 and the dielectric layer stack 130. The portions of the lining layer 170 at the sidewall, the bottom surface, and the top surface of the dielectric layer stack 130 are removed by etching. An etching gas used during removing the portions of the lining layer 170 etches the lining layer 170 at the sidewalls, the bottom surface, and the top surface of the dielectric layer stack 130 faster than etches the lining layer 170 in the sharp corners C1. The etching gas may be chosen based on the material of the lining layers 170. In some embodiment, the etching gas may be a combination of $CF_4$, $O_2$, and Ar. In particular, the space of the sharp corner C1 is smaller than the main portion of openings O3. Therefore, it is difficult for the etching gas to etch the lining layer 170 in the sharp corner C1. The lining layers 170' remains in the sharp corners C1, and the sidewalls of the first nitride layers 132 and the isolation structures 160 are exposed again. As such, the sidewall of the lining layer 170', the sidewall of the first nitride layer 132 of the dielectric layer stack 130 and the sidewall of the isolation structure 160 define a round corner C2. The width of the openings O2 becomes larger as being farther from the first nitride layer 132 after removing portions of the lining layers 170. Stated another way, the remaining portion of the lining layer 170' has a concave surface CS connecting the sidewall of the first nitride layer 132 of the dielectric layer stack 130 and the sidewall of the isolation structure 160 after removing the portions of the lining layer 170 at the sidewall of the first nitride layer 132 of the dielectric layer stack 130.

The lining layers 170' are used to prevent the contacts formed in the subsequent process from being in contact with each other, which may cause a short circuit. Specifically, the lining layers 170' are formed in the sharp corner C1 between the first nitride layers 132 and the isolation structures 160. Therefore, even if adjacent sharp corners C1 connect with each other, the contacts formed in the subsequent process are not in contact with each other through the sharp corners C1. The contacts formed in the subsequent process do not cause the short circuit accordingly.

Figure 7B:
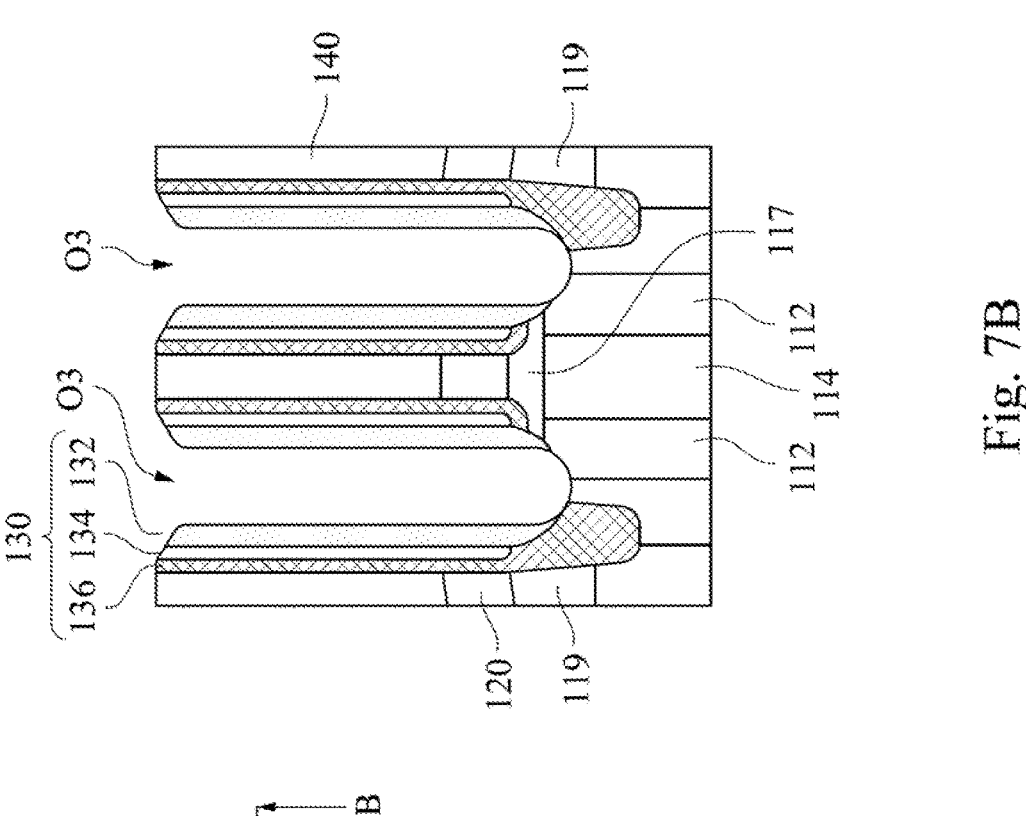
Figure 7A:
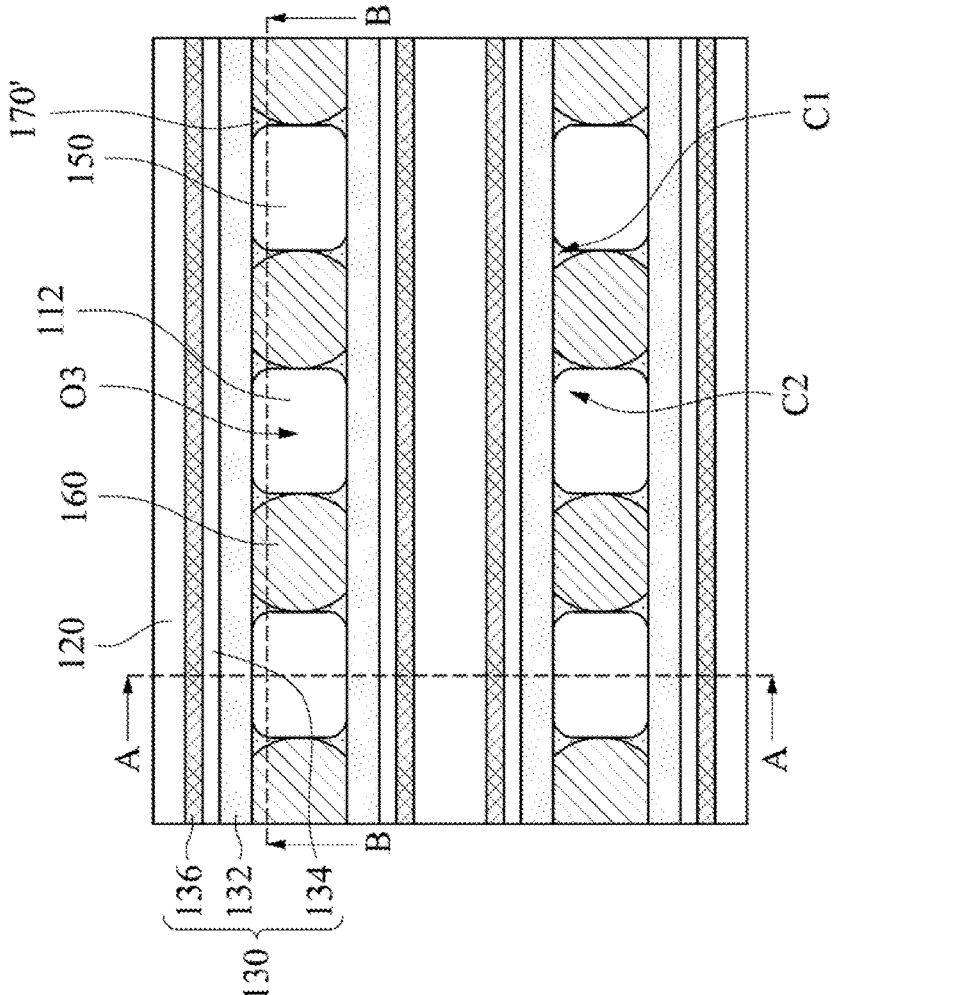
Figure 7C:
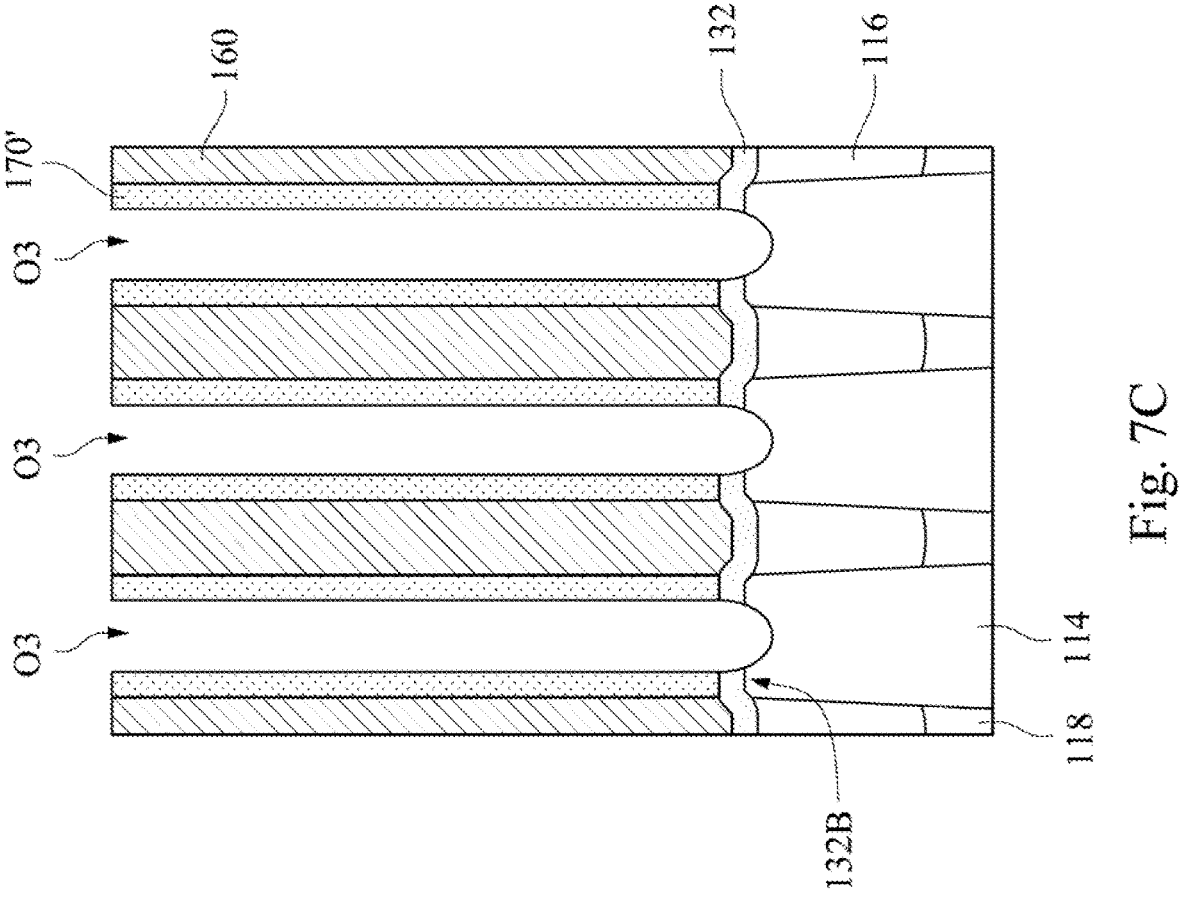

Referring to FIGS. 7A-7C, the bottoms of the dielectric layer stacks 130 exposed by the openings O3 are removed to expose the active areas 112. The bottoms of the first nitride layers 132 may be removed by performing an etching process. In some embodiments, the etching process may be a dry etching, wet etching, or combinations thereof. The etchant used during removing the portion of the lining layer 170 is different from the etchant used during removing the bottom of the dielectric layer stack 130. The etchant may be chosen based on the material of the first nitride layers 132. In some embodiment, the etchant may be a combination of $CF_4$, He and Ar. Therefore, the lining layers 170' are not removed after removing the bottom of the first nitride layers 132. Since the lining layers 170' are still in place, the dielectric layer stacks 130 includes bottom portions 132B under and in contact the lining layers 170'. Stated another way, the bottom portions 132B of the dielectric layer stacks 130 are covered by the lining layers 170' and are not removed during exposing the active areas 112. The sidewall of the lining layers 170' are aligned with the sidewall of the bottom portion 132B of the dielectric layer stack 130. For clarity, FIG. 7A illustrates that only the active areas 112 are exposed after removing the bottom of the dielectric layer stacks 130. However, other layers, such as isolation layers 114, are also exposed after removing the bottom of the dielectric layer stacks 130, as shown in FIGS. 7B and 7C. In some embodiments, the top of the dielectric layer stacks 130 are partially removed, so that the dielectric layer stacks 130 have slanted top surfaces.

Figure 8B:
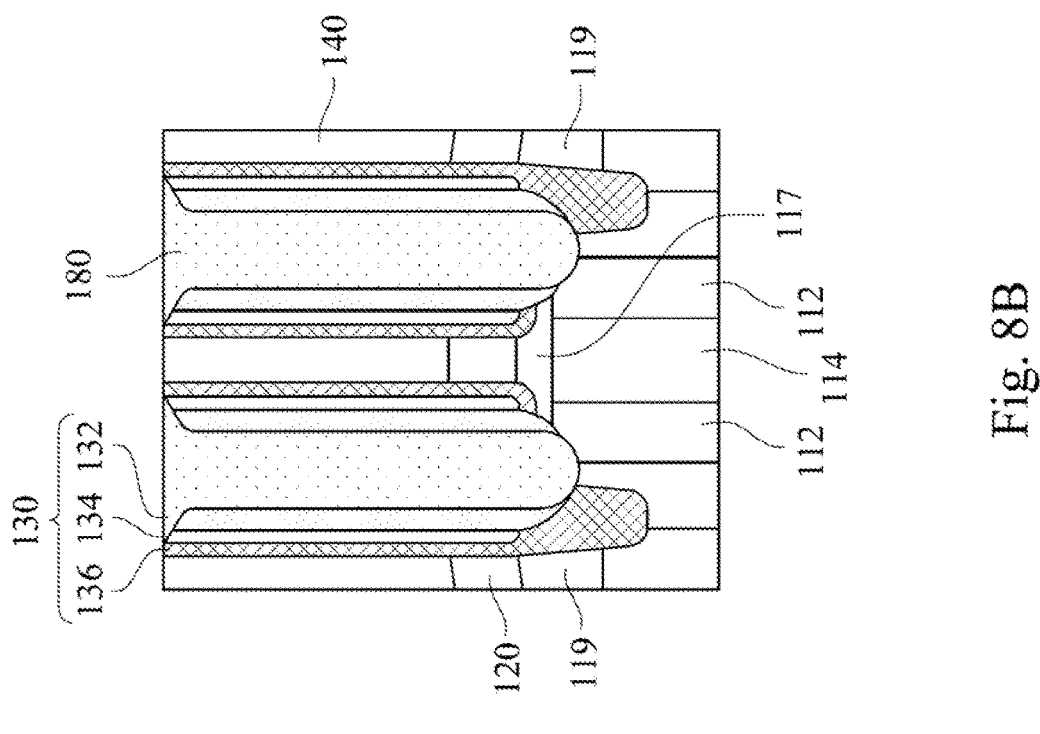
Figure 8A:
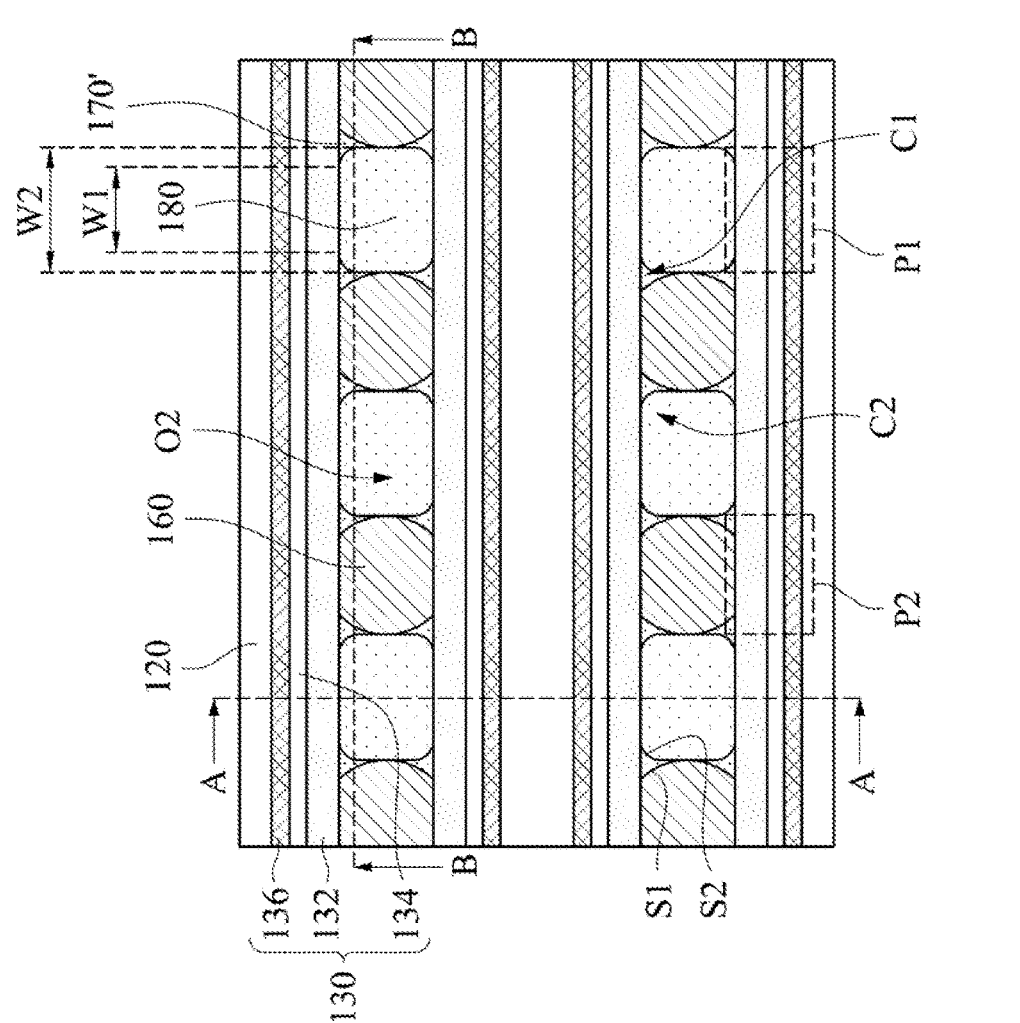
Figure 8C:
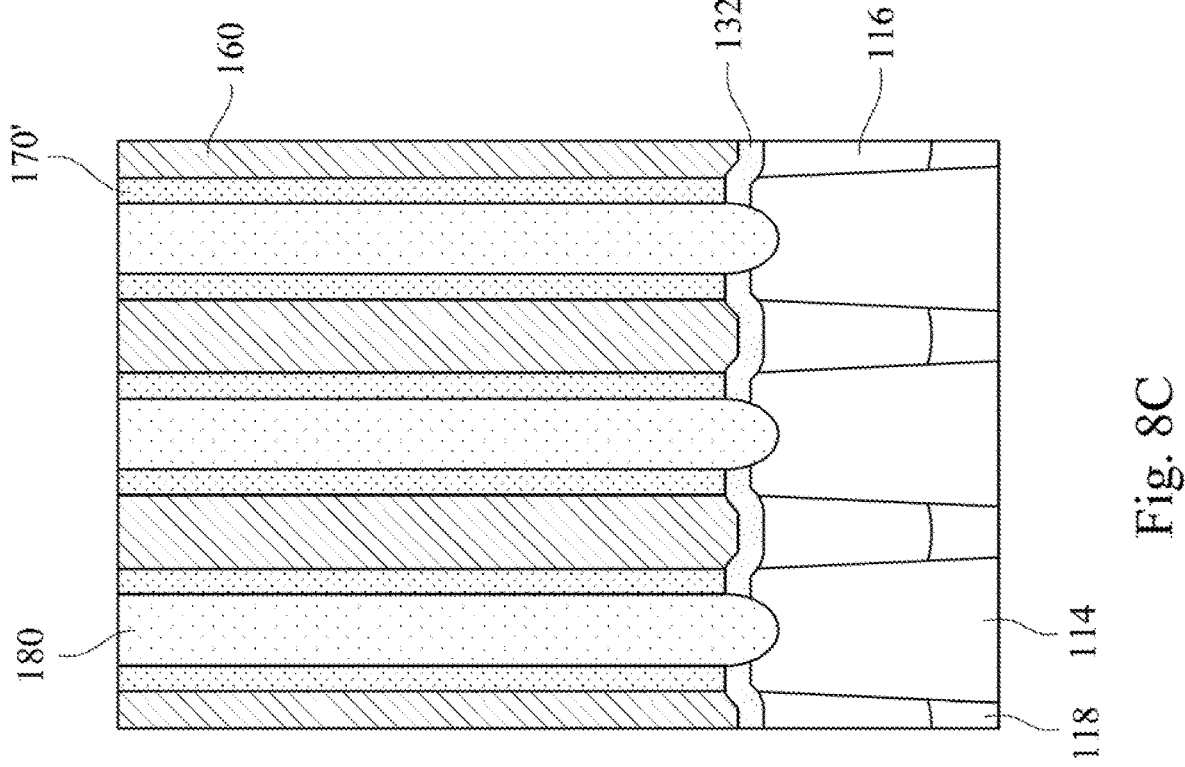

Referring to FIGS. 8A-8C, contacts 180 are formed in the opening O2 of the dielectric layer stack 130, and the semiconductor device is shown in FIGS. 8A-8C. The semiconductor device includes the bitlines 120, the dielectric layer stacks 130, the isolation structures 160, the lining layers 170' and the contacts 180. The dielectric layer stack

130 includes the first nitride layer 132, the oxide layer 134 and the second nitride layer 136 arranged from the bitline 120 to the contact 180. The isolation structures 160 are in contact with the sidewall of the dielectric layer stack 130, and the sidewall of the dielectric layer stack 130 and the sidewall of the isolation structure 160 defines the sharp corner C1. The lining layers 170 are at the sharp corner C1, and the sidewall of the lining layer 170', the sidewall of the dielectric layer stack 130 and the sidewall of the isolation structure 160 define the round corner C2. The contacts 180 are in contact with the sidewall of the dielectric layer stacks 130, the sidewall of the isolation structures 160 and the sidewall of the lining layers 170'. The dielectric layer stack 130 further has a first portion P1 between the bitline 120 and the contact 180 and a second portion P2 between the bitline 120 and the isolation structure 160. Stated another way, the contacts 180 are in contact with the sidewall of the dielectric layer stacks 130 and the sidewall of the isolation structures 160, and the lining layer 170' is between the contact 180, the isolation structure 160 and the dielectric layer stack 130. In some embodiments, the contacts 180 are made of metal, such as tungsten.

The contour of the contact 180 has the round corner C2 defined by the sidewall of the dielectric layer stack 130, the sidewall of the isolation structure 160 and the sidewall of the lining layer 170'. That is, the contacts 180 have round corners C2 in a top view. Accordingly, the lining layer 170 has a first concave surface S1 in contact with the isolation structure 160 and a second concave surface S2 in contact with the contact 180. The minimum width W1 of the contact 180 parallel to the sidewall of the dielectric layer stack 130 is at the sidewall of the dielectric layer stack 130. The maximum width W2 of the contact 180 parallel to the sidewall of the dielectric layer stack 130 is substantially at the center of the contacts 180. In other words, the width of the contact 180 becomes greater as farther from the sidewall of the dielectric layer stack 130. Adjacent contacts 180 are separated by the isolation structures 160 and the lining layers 170'. The round corner C2 of the contact 180 is adjacent to the sharp corner C1 defined by the sidewall of the dielectric layer stack 130 and the sidewall of the isolation structure 160. Therefore, the contacts 180 may not extend through the sharp corners C1 and in contact with each other. The possibility of the short circuit forming between the contacts 180 is reduced. Moreover, since the sharp corners C1 are filled with the lining layers 170', the material of the contacts 180 are easily formed in the openings O2. The contacts may be formed with less voids accordingly. The contacts 180 may be made of any suitable method, such as doped poly silicon. The semiconductor device further includes active areas 112 under the contacts 180 and in contact with the contacts 180.

Some embodiments of the present disclosure provide advantages. Specifically, the lining layers are formed in the sharp corners between the isolation structures and the dielectric layer stack. Therefore, the contacts formed between the isolation structures do not extend through the sharp corners to connect with other, thereby reducing the possibility of short circuits between the contacts.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
   a dielectric layer stack;
   an isolation structure in contact with a sidewall of the dielectric layer stack, wherein the sidewall of the dielectric layer stack and a sidewall of the isolation structure define a sharp corner in a top view;
   a lining layer at the sharp corner, wherein a sidewall of the lining layer, the sidewall of the dielectric layer stack and the sidewall of the isolation structure define a round corner in the top view; and
   a contact in contact with the sidewall of the dielectric layer stack, the sidewall of the isolation structure and the sidewall of the lining layer.

2. The semiconductor structure of claim 1, wherein a contour of the contact has a round corner defined by the sidewall of the dielectric layer stack, the sidewall of the isolation structure and the sidewall of the lining layer.

3. The semiconductor structure of claim 1, wherein an interface is between the lining layer and the isolation structure.

4. The semiconductor structure of claim 1, wherein the dielectric layer stack comprises a bottom portion under and in contact the lining layer.

5. The semiconductor structure of claim 1, further comprising a bitline, wherein the dielectric layer stack has a first portion between the bitline and the contact and a second portion between the bitline and the isolation structure.

6. The semiconductor structure of claim 5, wherein the dielectric layer stack comprises a first nitride layer, an oxide layer and a second nitride layer arranged from the bitline to the contact.

7. The semiconductor structure of claim 1, further comprising an active area under the contact and in contact with the contact.

8. A semiconductor structure, comprising:
   a dielectric layer stack;
   an isolation structure in contact with a sidewall of the dielectric layer stack, wherein the sidewall of the dielectric layer stack and a sidewall of the isolation structure defines a sharp corner in a top view;
   a contact in contact with the sidewall of the dielectric layer stack and the sidewall of the isolation structure, wherein the contact has a round corner in the top view; and
   a lining layer between the contact, the isolation structure and the dielectric layer stack.

9. The semiconductor structure of claim 8, wherein the round corner of the contact is adjacent to the sharp corner defined by the sidewall of the dielectric layer stack and the sidewall of the isolation structure.

10. The semiconductor structure of claim 8, wherein the lining layer has a first concave surface in contact with the isolation structure and a second concave surface in contact with the contact.

11. The semiconductor structure of claim 8, wherein compositions of the lining layer and the isolation structure are different.

12. The semiconductor structure of claim 8, wherein a minimum width of the contact parallel to the sidewall of the dielectric layer stack is at the sidewall of the dielectric layer stack.

13. The semiconductor structure of claim 8, wherein a maximum width of the contact parallel to the sidewall of the dielectric layer stack is substantially at the center of the contact.

14. The semiconductor structure of claim 8, wherein the dielectric layer stack comprises a bottom portion under and in contact the lining layer, and a sidewall of the lining layer is aligned with a sidewall of the bottom portion of the dielectric layer stack.

* * * * *